United States Patent [19]

Leong

[11] Patent Number: 4,649,626

[45] Date of Patent: Mar. 17, 1987

[54] SEMICONDUCTOR ON INSULATOR EDGE DOPING PROCESS USING AN EXPANDED MASK

[75] Inventor: Douglas H. Leong, Fountain Valley, Calif.

[73] Assignee: Hughes Aircraft Company, Los Angeles, Calif.

[21] Appl. No.: 758,600

[22] Filed: Jul. 24, 1985

[51] Int. Cl.$^4$ ............... H01L 21/205; H01L 21/86
[52] U.S. Cl. ............................ 29/571; 29/576 B; 29/578; 29/580; 148/1.5; 148/175; 148/187; 148/188; 148/DIG. 106; 148/DIG. 111; 148/DIG. 131; 148/DIG. 150; 156/643; 357/4; 357/23.7; 357/23.11; 357/23.12
[58] Field of Search ............ 29/571, 578, 580, 576 B; 148/DIG. 106, 131, DIG. 111, 150, 175, 187, 188, 1.5; 156/643; 357/23.7, 23.11, 23.12, 42, 4

[56] References Cited

U.S. PATENT DOCUMENTS

| | | | |
|---|---|---|---|
| 3,890,632 | 6/1975 | Ham et al. | 148/DIG. 150 |
| 4,054,895 | 10/1977 | Ham | 148/DIG. 150 |
| 4,252,574 | 2/1981 | Fabula | 148/1.5 X |
| 4,256,514 | 3/1981 | Pogge | 156/643 X |

OTHER PUBLICATIONS

Feth et al., "Thin-Base Lateral PMP Transistor Structure" I.B.M. Tech. Discl. Bull., vol. 22, No. 7, Dec. 1979, pp. 2939-2942.

Primary Examiner—William G. Saba
Attorney, Agent, or Firm—Joseph E. Szabo; Anthony W. Karambelas

[57] ABSTRACT

Edge conduction in a silicon-on-sapphire transistor is minimized by a process which permits precise doping of the edge channel regions of the transistor. The silicon island (19) containing the transistor (24) is precisely doped around its edges by ion implanting an epitaxial silicon layer (13) on a sapphire substrate (11), with an oxide mask (29) covering, with the exception of a narrow peripheral edge (37), the portion of the silicon which is eventually to form the island (19') on which the transistor is to be constructed. The mask (29) is then expanded by the addition of a sleeve (43) to cover the additional peripheral edge region (37) in the silicon. When the silicon is subsequently etched using the expanded oxide pattern 45 as a mask, the periphery of the remaining silicon will be doped to a predetermined depth (37) corresponding to the width of the sleeve (43).

6 Claims, 19 Drawing Figures

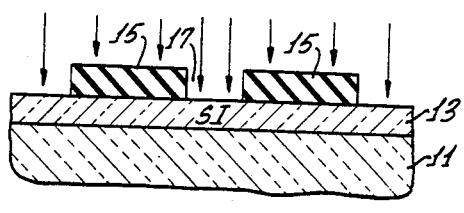
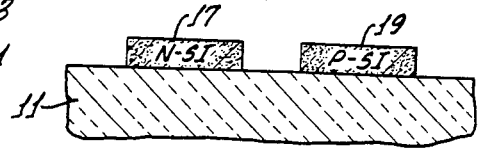
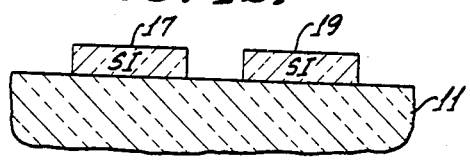
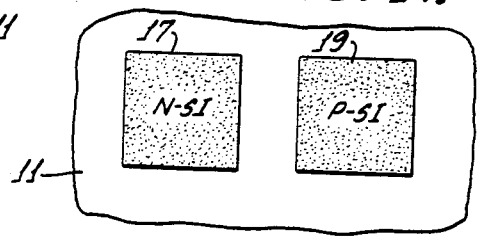
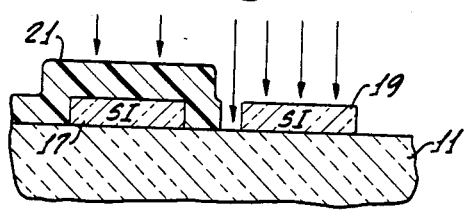
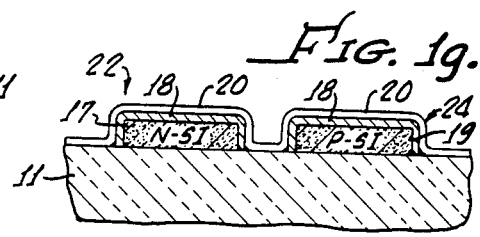
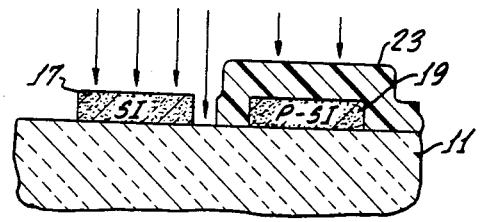
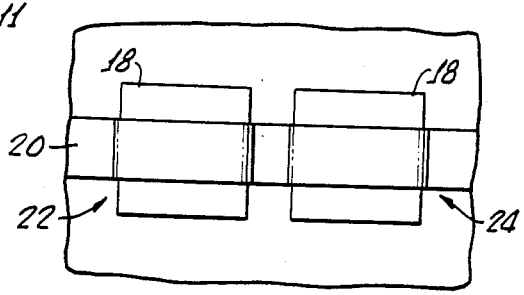
(PRIOR ART)

SEMICONDUCTOR ON INSULATOR EDGE DOPING PROCESS USING AN EXPANDED MASK

The Government has rights in this invention pursuant to Contract No. DAAK20-81-C-0383 awarded by the Department of the Army.

CROSS-REFERENCE TO RELATED APPLICATION

This patent application is related to U.S. patent application Ser. No. 707,368, now abandoned, filed Mar. 1, 1985, by Douglas H. Leong, entitled "Semiconductor On Insulator Edge Doping Process," assigned to the assignee of the present invention.

BACKGROUND OF THE INVENTION

1. Field of the Invention

The present invention relates generally to field effect transistors of the type formed in semiconductor islands supported on an insulating substrate, and more particularly to a method for doping the edges of such semiconductor islands in order to improve transistor performance.

2. Description of Related Art

Field effect transistors are generally devices formed in the surface of a semiconductor such as silicon. They consist of a pair of high conductivity regions called the "source" and the "drain" separated by a gap called the "channel." A conductor called the "gate" extends over the channel and controls the flow of current from the source to the drain when a voltage is applied across them and another voltage is applied between the source and the gate.

Field effect transistors can be either P-channel or N-channel devices. P-channel devices consist of P-type source and drain regions separated by an N-type region in which the P-channel is induced by a negative control voltage applied to the gate electrode. Conversely, an N-channel device consists of N-type source and drain regions separated by a P-type region in which an N-channel device is induced by applying a positive control voltage to the gate electrode.

An alternative to the conventional field effect transistor structure is a device which is formed in a thin layer of semiconducting material supported by an insulating substrate. Heretofore, silicon has been the semiconductor of choice and sapphire has been the preferred substrate. This technology is frequently referred to as silicon-on-sapphire, or SOS for short. Other combinations of semiconductors and insulating substrates are possible and may in fact supplant silicon-on-sapphire. In one of these the insulating substrate consists of a silicon substrate covered by a silicon dioxide layer. Since the substrate is an insulator, to the extent that it affords insulation between components formed on its silicon dioxide layer which is an insulator, this type of substrate shall be referred to herein as an insulating substrate.

In silicon-on-sapphire devices each transistor is formed in an island of silicon supported by the sapphire substrate. The gate extends across the top of the island and overlaps the edges. For sake of a convenient frame of reference, the substrate will be considered to be horizontal and the sides of the silicon islands to be vertical. In such a device each transistor is really a composite of three individual transistors, one formed by the horizontal gate portion running along the top of the silicon island, and the other two being formed by the vertical portions of the gate which run down the sides of the island, which are called "edge transistors."

One common problem found in field effect transistors with edges is the difference between the turn-on voltage of their edge transistors relative to that of their top transistor. Depending on the sign of this difference, the edge transistors can turn on at either a lower or higher voltage than the top transistor. The biggest problem occurs when the edge transistors turn on at a lower voltage, resulting in so-called "sub-threshold" conduction. This can happen if the edge transistors have a lower doping level or higher gate insulator charge density than the top transistor. Such charge density can be due to the crystallographic orientation of the edge or to charge created by radiation. Since such charge is normally positive, this problem is much more common in N-channel than in P-channel devices.

The reason for this is that both the transistor which is formed in the top of the island and the transistors which are formed on the edges of the island have a positive threshold voltage. That is, it will take a positive control voltage to establish the negative charges in the channel necessary to establish conduction between the source and drain regions for all three transistors. If the excess charge is larger in the edges than in the top surface of the silicon island, a shift in threshold caused by the excess charge will be larger in the vertically disposed transistors that it is in the horizontally disposed transistor. In the N-channel devices the effect of this threshold shift is to cause the transistor to turn on at a lower voltage than it would otherwise. The greater the threshold shift, the smaller is the voltage at which the transistor will turn on. The ultimate effect in the case of N-channel devices is that the vertically disposed transistor segments will have a lower threshold voltage than the horizontally disposed transistor segment. As a result, the composite transistor which is made up of all three segments does not have a single sharply-defined turn-on voltage. Rather, it turns on gradually, with current commencing in the vertically disposed transistors at a given voltage and this current is reinforced by the principal, horizontally disposed portion of the transistor at a slightly higher threshold voltage. The threshold shift in the N-channel devices is also undesirable because it can cause appreciable current flow in transistors which are in the "OFF" state. In an integrated circuit this can result in a large quiescent current which must be supplied by the power supply. This could be a problem, especially for battery-operated power supplies, as in a satellite.

Conversely, with P-channel devices the threshold shift caused by excess charge along the sides of the silicon island tends not to be a problem because the net effect is to increase the threshold and, hence, turn-on voltage of the vertically disposed portions of the transistor so that they require a larger voltage to conduct than does the horizontally disposed portion of the transistor. The resulting threshold increase of the composite transistor is negligible.

Excess charge can also result from the transistor being subjected to high levels of radiation. Since it is desirable that transistors remain operational while they are subjected to such levels of radiation (such transistors being referred to as "radiation hardened") as may be encountered in outer space, for example, it is highly desirable to overcome the effects of excess charge on the operation of such transistors.

Efforts have been made in the past to minimize the problem of edge conduction in silicon-on-sapphire transistors. The basic approach has been to selectively dope the edges of the silicon island so that the dopant concentration in the channels of the vertically disposed transistors would be higher than it is along the channel of the horizontally disposed transistor. This expedient has the effect of substantially cancelling the threshold shift caused by the excess charge in the edges of the silicon island. Two approaches have been used; both have been problematic. One technique is to use a process for forming silicon islands with sloped edges. This technique employs a preferential etch process using potassium hydroxide as the etchant which has the effect of leaving the silicon islands with edges having a 57° slope. With the islands so formed, and leaving the island mask in place, subjecting the silicon islands to vertically impinging ions (ion implantation) would result in selectively doping the edges of the silicon islands. The problem with this technique is that, toward the base of the island where its sides meet the underlying substrate, the ions would pass right through the islands, leaving the sides in those regions undoped.

Another technique for selectively doping the edges of the silicon islands has been to leave the mask used to define the silicon islands during the etching process in place and use this mask with a subsequent step, during which a dopant is diffused into the island's edges. This edge-doping process is difficult to control insofar as both dopant density and diffusion depth are concerned.

An improved method for edge doping is the subject of my above-identified related application, Ser. No. 707,368, now abandoned. As disclosed therein, the edges of the semiconducting island in which the transistor is to be formed and which is carried upon an insulating substrate are selectively formed by a process whose initial step is to form a mask over a wafer comprising a layer of semiconducting material formed on an insulating substrate, with the mask defining the island of semiconducting material in which the transistor is to be formed. With the wafer so masked, the regions of the semiconducting material which are not covered by the mask are implanted with a dopant, while the region of the semiconducting material that is covered by the mask remains undoped. The wafer is then heated at a temperature and for a period of time selected so as to drive the dopant laterally beneath the mask by a predetermined amount. The regions of the semiconducting material not covered by the mask are then removed, typically by exposing them to an etchant which is resisted by the mask. This leaves in place the desired semiconducting island capped by the mask and doped along its edges to the preselected (lateral) depth. Thereafter the mask is removed from the top of the semiconducting island. Fabrication of the transistor may be completed through conventional steps by which the rest of the silicon island is doped, the control gate and the source and drain regions are formed, and conductors are attached to those regions.

The process just described works well. It does, however, require a measure of control, during the heating and driving step, over lateral diffusion of dopant in the semiconducting material beneath the mask, since that is what determines the lateral extent of the edge doped regions.

Accordingly, it is a principal object of the present invention to provide an alternative method for edge doping a field effect transistor of the type formed on semiconducting islands supported by an insulating substrate so as to minimize the effect of edge transistor turn-on, wherein the lateral extent of the edge doped regions is determined by other than a diffusion step.

SUMMARY OF THE INVENTION

In keeping with the above object of the present invention, in the course of fabricating a field effect transistor as summarized with reference to my related application, the edges of the semiconducting island are selectively formed by a process whose initial step is to form a mask over a wafer comprising a layer of semiconducting material formed on an insulating substrate, with the mask defining all but a relatively narrow peripheral edge of the island of semiconducting material in which the transistor is to be formed. With the wafer so masked, the regions of the semiconducting material not covered by the mask are implanted with a dopant, while the region of the semiconducting material covered by the mask remains undoped. The mask is then expanded to cover the additional semiconducting material which is to form the just mentioned peripheral edge of the island. The regions of the semiconducting material not covered by the expanded mask are then removed, typically by exposing them to an etchant which is resisted by the expanded mask. This leaves in place the desired semiconducting island capped by the expanded mask and doped along its edges to a preselected (lateral) depth which is determined by the size of the increase in the mask during its expansion. Thereafter, the entire mask is removed from the semiconducting island. Fabrication of the transistor may be completed through conventional steps by which the rest of the silicon island is doped, the control gate and the source and drain regions are formed, and conductors are attached to those regions.

BRIEF DESCRIPTION OF THE DRAWINGS

FIGS. 1a through 1h are views during successive steps of a prior art process for fabricating a pair of opposite conductivity type silicon-on-sapphire transistors combined to form a complementary pair.

DETAILED DESCRIPTION OF THE INVENTION

Figure 2:
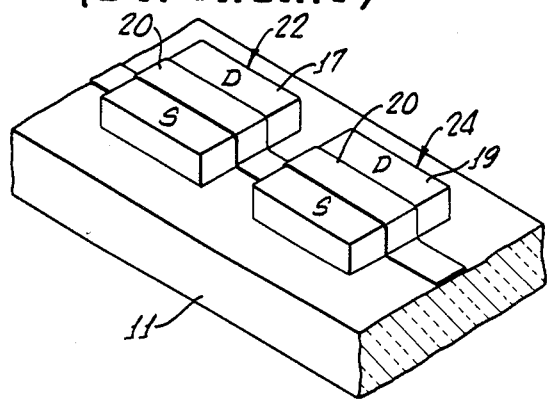
FIG. 2 is a perspective view of a complementary transistor pair formed by the prior art process of FIG. 1.

There will be first described, with reference to FIGS. 1a–1h, a conventional process for fabricating a silicon-on-sapphire complementary transistor pair. It will be understood that other semiconductors and substrates may be used and that the invention may find use not only with complementary devices but with transistors of a single conductivity type as well.

The process begins with a wafer comprising a layer 13 of epitaxial silicon deposited on a sapphire substrate 11. A photo-resist layer 15 is deposited on the epitaxial silicon layer 13 and by the use of a mask is selectively exposed to light so as to leave a photoresist mask which exposes those parts of the epitaxial silicon layer which are to be removed. The exposed portions of the epitaxial silicon layer 13 are removed by a reactive ion etch, or by any other suitable anisotropic etch which will etch so as to leave vertical silicon walls with little or no undercutting of the photoresist mask. The etch must have sufficient selectivity to etch the silicon without excessive etching of the photoresist mask, whose thickness is typically 1.0 to 1.6 μm. Any of the photoresists commonly used in the semiconductor industry, such as Shipley 1470, might be used for this process.

Next, the photoresist mask 15 is stripped, leaving the islands of silicon 17 and 19 (FIG. 1b). Another photoresist layer 21 is applied over the silicon island 17, leaving the silicon island 19 exposed. The exposed island is then doped by ion implantation (FIG. 1c), typically with boron, so as to impart P-type conductivity characteristics to the silicon island. A typical implant dose is $4 \times 10^{12}$ per cm² (FIG. 1c). When implanted into a 0.5 μm thick silicon film, this results in an average dopant concentration of $8 \times 10^{16}$ per cm$^{-3}$.

During the next step, the just doped silicon island 19 is masked with photoresist and subjected to an N conductivity type dopant implantation comparable in concentration (2 to $3 \times 10^{12}$ per cm²) to that used with the island 17 so as to impart to the island 19 N-conductivity type conduction characteristics.

When the mask 23 is removed, a pair of silicon islands 17 and 19 are left on the sapphire substrate (FIGS. 1e and 1f) in which opposite conductivity type transistors may be formed through conventional steps. These steps (not shown in detail) include formation of an oxide layer (the gate oxide) over the entire surface of each of the silicon islands 17 and 19, and the formation of a conductive gate strip, typically polycrystalline silicon 20, over the oxide layer 18. The silicon gate strip 20 runs generally across the centers of the silicon islands 17 and 19, being separated therefrom by the oxide layer 18. On either side of the gate strip 20 source and drain regions are conventionally formed in the silicon island by doping those regions with a dopant of a conductivity type opposite that of the conductivity type previously imparted to the island during the step depicted in FIGS. 1c and 1d. Typical implant doses are in the $10^{15}$ per cm² range, giving dopant concentrations in the $10^{19}$ to $10^{20}$ per cm³ range. Masks similar to those used previously to dope the islands are used to mask the source-drain doping, and the gate electrode also acts as a mask, so that the source and drain regions are self-aligned to the gate electrode, and cover the entire island except for the region under the gate electrode. Next, an insulating layer, typically silicon dioxide 0.5 to 1.0 μm thick, is deposited over the wafer. Then a photoresist mask is deposited and patterned, and contact openings are etched in the insulating layer. Finally, a metal film is deposited and patterned to connect the source, drain and gate regions so as to complete the device.

The general configuration of the resulting complementary transistor pair comprising the P-channel transistor 22 and the N-channel transistor 24 is depicted in FIG. 2. The source and drain regions of the respective transistors are identified by the letters S and D. The contacts to those regions are not shown.

Figure 6:
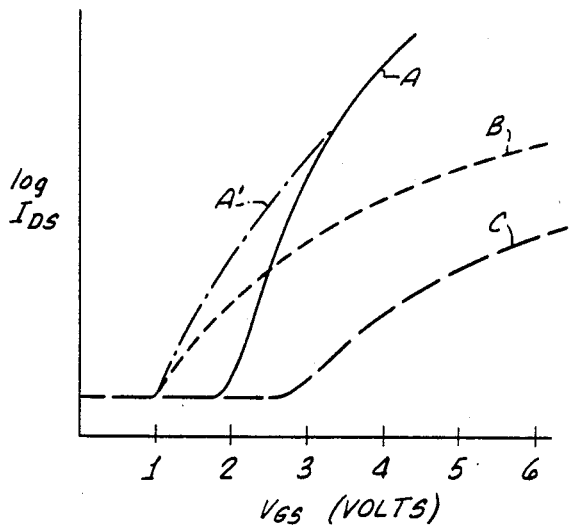
FIG. 6 comprises a set of curves illustrating the effect of edge-transistor currents in transistors fabricated in accordance with the prior art process and in accordance with the process of the present invention.

The problem with the prior art silicon-on-sapphire transistor can best be appreciated with reference to FIGS. 2 and 6. As was explained previously, edge conduction is normally a problem only with the N-channel transistor 24, which is really a composite of three transistors, one comprising the portion of the gate strip 20 running along the top of the silicon island 19, the second comprising the shorter vertical portion of the gate strip 20 visible to the right of the horizontal portion of the gate, and the third running along the side opposite to that last mentioned.

The edge current phenomenon is illustrated in FIG. 6. Curve A is a plot of the source-to-drain current in transistor 22 attributable to the portion of the transistor defined by the horizontal portion of the gate 20. Curve B is a plot of the source-to-drain current in the "edge" transistor portion of the N-channel transistor 24. It is apparent that conduction in the edge transistor regions begins at a lower gate-to-source voltage than conduction in the principal portion of the transistor. It is also apparent that the ultimate size of the current due to the horizontal portion of the transistor is greater than that due to the edge transistor portions, because of the geometry of the device which typically would include a silicon island several microns in width versus approximately 0.5 microns in height. The composite current source-to-drain in the transistor 24 is plotted in Curve A' and is seen to have an undesirable hump relative to the Curve A, the hump being due to the current contribution of the vertical, or edge, transistor portions of the device 24.

The present invention is directed to shifting the curve of current versus gate-to-source voltage for the edge transistor from that depicted by Graph B to that depicted by Graph C in FIG. 6. By shifting the threshold of the gate-to-source voltage at which edge transistor conduction begins, the composite curve of the transistor can be brought back essentially to that depicted by Graph A, since the contribution of current by the edge transistors will be negligible at the higher voltages at which such conduction would begin. The manner in which this threshold voltage shift for the edge transistors is achieved is illustrated in FIGS. 3a through 3e. Again, the description will be in terms of a silicon-on-sapphire device, it being understood that the technique could also be applied to devices formed in other semiconductors supported on other types of substrate.

Figure 3A:
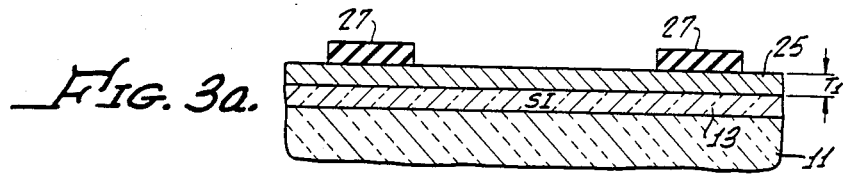
FIGS. 3a through 3g depict successive steps in accordance with the present invention which, when added to the steps of the prior art process of FIGS. 1a through 1h, result in an improved device.
Figure 3B:
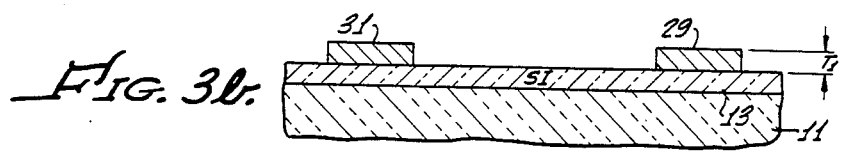
Figure 3C:
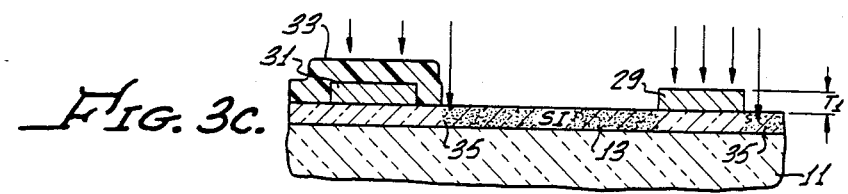

The process begins by using the same type of dual-layer wafer 11, 13 as that used in the process depicted in FIGS. 1a through 1h. However, an additional oxide layer 25 is deposited on the epitaxial silicon layer 13. The oxide is typically formed in a conventional chemical vapor deposition process using a mixture of $SiH_4$ (silane) and $O_2$. Temperatures in the range of 400° to 900° C. can be used. Its thickness, $T_1$, should be on the order of 0.5 microns to 1 micron. In order to pattern the oxide layer 25, a photoresist mask 27 is formed on top of it (FIG. 3a) after which the oxide layer is etched in a pattern defined by the photoresist mask 27, leaving a pair of oxide islands 29 and 31 (FIG. 3b). The purpose of the next step, depicted in FIG. 3c, is to implant a dopant into the epitaxial silicon layer 35 in the area surrounding the oxide island 29. Toward this end the epitaxial silicon/sapphire wafer is covered with a photoresist in all areas except for the portion covered by the oxide island 29 and a region which surrounds that island. The wafer is then subjected to an ion implanting beam, as depicted by the arrows in FIG. 3c. For reasons which will become apparent, boron, a P-type dopant, is used. The optimum implant dose is approximately $1 \times 10^{14}$ per cm². The oxide island 29 will have been formed to have a thickness sufficient to allow the dopant to penetrate the epitaxial silicon layer 13 all the way down to the sapphire substrate 11 without penetrating into the silicon under the oxide island 29.

The energy and dose of the implantation can be adjusted so as to maximize the doping in that vertical region of the edge which contributes most significantly to edge conduction. It is believed that under some circumstances, the region of the edge that contributes the most to edge conduction is near the bottom of the edge, while in other cases it may be located near the top. Consequently, it may be desirable to give the edges an uneven doping profile, with the maximum edge doping occurring somewhere between the top and the bottom of the silicon island. Alternatively, it may be more desirable to achieve a uniform dopand distribution along the entire vertical edge, in which event multiple implants, with a succession of energy-dose combinations, may be performed in order to achieve such uniform dopant distribution.

Figure 3D:
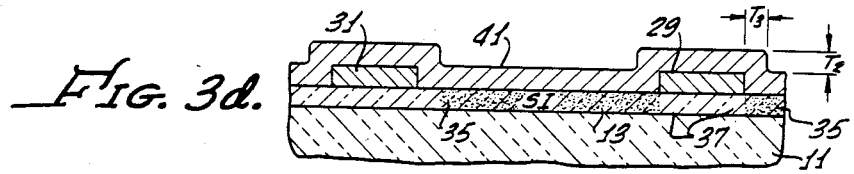

Once the ion implantation step of FIG. 3c is complete, the photoresist 33 is removed and the next step of the process, whereby the size of the doped edge region is defined, is ready to begin. As depicted in FIG. 3d, this step begins with the formation of a second layer 41 of thickness $T_2$ over the oxide island 29. Since the layer 41 will be patterned to form an extension of the oxide island 29 to form an expanded mask, the layer 41 is preferably comprised of silicon dioxide as well. For reasons which will become apparent, however, it is desirable to so formulate the layer 41 as to give it a faster etch rate than that of the oxide island 29.

Although the following steps, including formation of the second layer 41, serve to expand the oxide island 29, and do not need to involve the other oxide island 31, it is convenient to subject both of the islands 29 and 31 to the same mask processing steps, and the process will be so illustrated herein. The description will, however, center on the oxide island 29, and only incidentally refer to the other island 31.

Figure 3E:
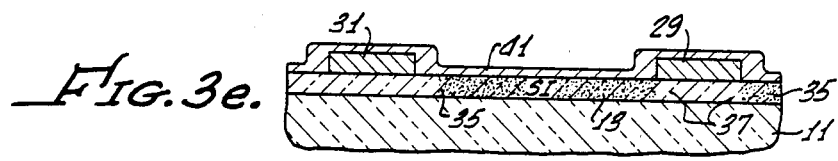
Figure 3F:
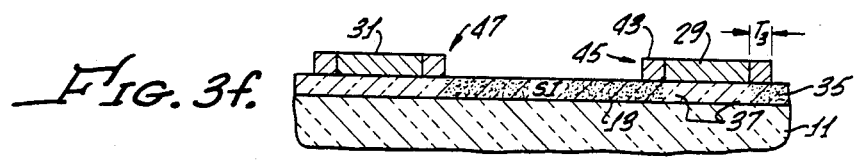
Figure 3G:
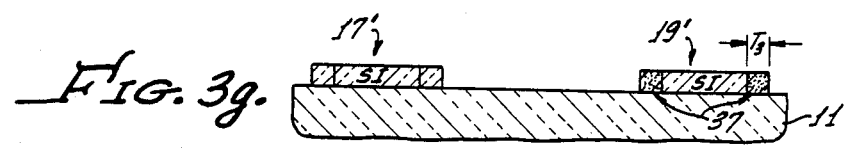

The second oxide layer 41 may be formed in the same manner as the initial oxide layer 25. Its etch rate can be made higher than that of the layer 25 by not subjecting it to a high-temperature densification process. Except for the region immediately surrounding the vertical edge of the oxide island 29, the thickness $T_2$ of the oxide layer 41 thus formed will be substantially uniform, both over the substrate surface and on the surface of the oxide island 29. The key to the success of the present invention is that, in the region immediately surrounding the oxide island 29, the thickness of the oxide layer 41 is approximately $T_1+T_2$. Consequently, by uniformly etching the oxide layer 41 all the way to the surface of the epicrystalline silicon 13, the oxide layer 41 will also be removed from atop the oxide island 29, leaving only a sleeve 43 of the oxide layer 41 surrounding the oxide island 29. To help visualize the process, it is shown in FIG. 3e at an intermediate stage of the etching step, where all but a thin portion of the layer 41 has been removed. It will be readily apparent that, by virtue of the increased thickness of the layer 41 in the area immediately surrounding the vertical edge of the silicon island 29, uniform etching of the oxide layer 41 leads to a relatively thick region of the oxide layer 41 surrounding the oxide island 29 so that, even when the etching process has removed all of the oxide layer 41 from the epicrystalline silicon layer 13 and the oxide island 29, a sleeve 43 of the layer 41 remains, as shown in FIG. 3f. The width $T_3$ of the oxide sleeve 43 surrounding the silicon island 29 is a function of the thickness $T_2$ of the silicon layer 41, and will normally be substantially equal thereto ($T_3=T_2$). Thus, the width $T_3$ of the oxide sleeve 43 can be readily predetermined by controlling the thickness of the oxide layer 41. This, then, becomes the controlling consideration in selecting the thickness of that layer.

In order to prevent inadvertently etching away the oxide island 29 during the step depicted in FIGS. 3e, 3f, it is desirable to impart to the oxide layer 41 a higher etch rate than that of the layer from which the oxide island core 29 was formed, and this can be achieved in the manner described above. By masking the oxide layer 41 "softer" than the silicon oxide island core 29, the etching step by which the oxide sleeve 43 is formed is made less critical so that once the silicon oxide island surface is reached, subsequent etching will only have the effect of reducing the thickness of the sleeve 43 relative to that of the core 29.

In selecting the thickness of the sleeve 43, the principal consideration is that it must be thick enough to satisfactorily function in one of the succeeding steps as a portion of the expanded mask to withstand penetration by the etchant used to remove exposed portions of the underlying epicrystalline silicon layer 13. Since a very thin (on the order of 0.3 micron) oxide layer may suffice as a mask which will effectively withstand such an etchant, the oxide sleeve 43 may be made very thin (also on the order of 0.3 micron). Oxide layer 29 must be thick enough to mask against the implant during step 3c, as well as the silicon island etch of step 3g.

In FIG. 3d the thickness $T_2$ of the oxide layer 41 is shown to be approximately equal to the height of the oxide island 29. This will yield a sleeve 43 whose height matches that of the oxide island 29. A relatively thinner oxide layer 41 may be acceptable, particularly where it is desired to produce a doped edge region 37 which is narrower than $T_1$. As stated earlier, the thinner the layer 41, the smaller the width of the oxide sleeve 43 and, hence, the narrower the doped edge region 37.

During the above process, along with the expanded oxide mask 45, the oxide mask 31 will also have been expanded to the slightly larger mask 47 shown in FIG. 3f. As will be seen, this is of no consequence to the present invention or to the fabrication of the illustrated device.

With the expanded oxide mask 45 properly formed, the silicon-on-sapphire wafer is subjected to a further anisotropic (i.e., vertical) etch, such as the reactive ion etch used in the step depicted in FIG. 1a.

During the etching step all portions of the epitaxial silicon layer 13 other than those covered by the expanded oxide islands 45 and 47 are removed. Once the etching step is complete, the oxide islands 45 and 47 are stripped away by conventional techniques, such as buffered HF, leaving the silicon islands 17' and 19' in place on the sapphire substrate 11. It will be noted that the island 17' is slightly wider but otherwise no different than it is when fabricated by the conventional steps 1(a)–1(b). On the other hand, the silicon island 19' is left with its edges doped in a manner which permits the doping concentration and the depth of doping to be controlled very precisely, since the vertical doping profile of the doped edges 37 is determined by the implantation dose and energy used during step 3(c) and the width $T_3$ is determined by the thickness of the oxide layer 41. Thus, the silicon island which is ultimately to form the N-channel transistor has been specially treated on the edges.

Figure 4:
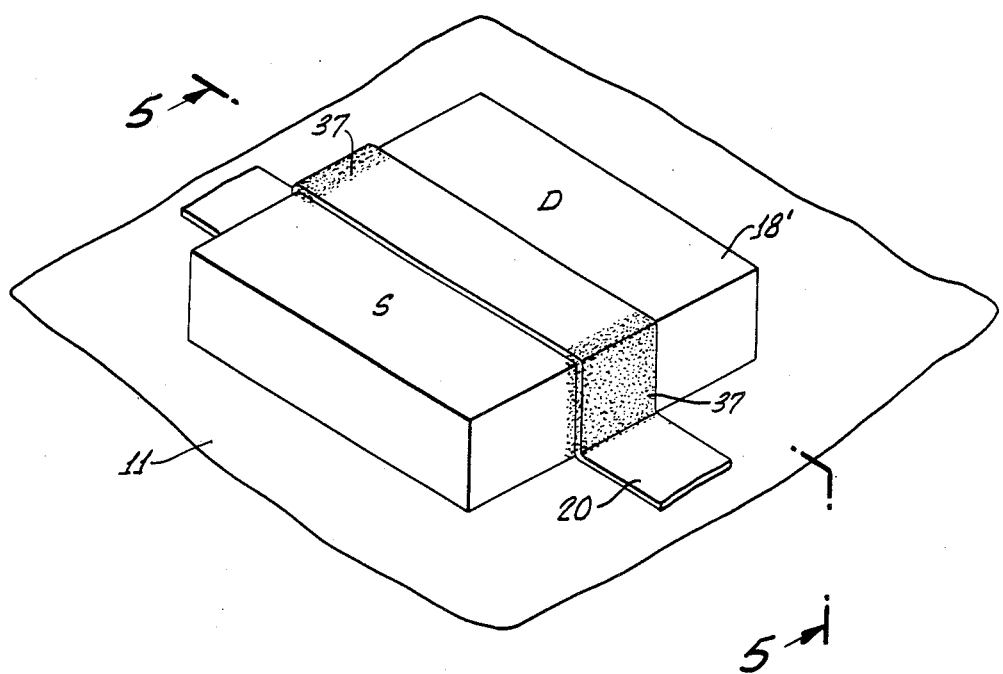
FIG. 4 is a perspective view of a transistor created in accordance with the present invention.
Figure 5:
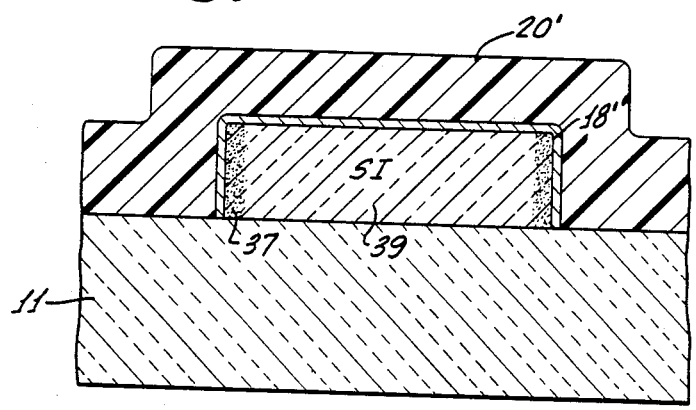
FIG. 5 is a cross-section along line 5—5 through the transistor illustrated in FIG. 4.

Fabrication of the transistor may now be completed through the conventional steps depicted in FIGS. 1c–1h. The N-channel transistor portion of the resulting device is depicted in FIGS. 4 and 5. It is seen to include source and drain regions marked S and D (contacts not shown) and a channel region 39, lying between the source and drain regions, with specially-doped edges 37. The edges 37 will have been doped during step 3c, whereas the source and drain regions will have been formed by the conventional steps following that depicted in FIG. 1h. The implant dose used for the source/drain implant will typically be much larger than that used for the edge doping, so the edge doping will have negligible effect on the doping level of the edges of the source and drain regions.

The principal advantage of the present invention by which edge doping is achieved in order to raise the threshold voltage of the edge transistors is the controllability of the width of the edge doped regions. This width can be readily and precisely controlled by varying the width of the silicon dioxide sleeve 43 created by the steps shown in FIGS. 3d–3f. The optimum width of the edge doped region will correspond to its depletion width, which is the maximum distance to which carriers can be depleted in its surface by applying an electric field. Anything greater than that will be superfluous. A width less than the depletion width will, naturally, be less effective but may still improve the performance of the transistor by reducing the edge transistor current. For silicon, the optimum width of the edge doping region will be on the order of about 1000 Angstroms. This corresponds approximately to the maximum depletion width of silicon having a doping level of about $10^{17}/cm^3$.

Since the preferred etchant-semiconductor combination is such that a vertical cut is created in the semiconductor in vertical registry with the edges of the expanded oxide island 45, the desired width of the oxide sleeve 43 will correspond to the desired width of the edge-doped region in the semiconductor island 19'. This may not always be the case, however. Some etchant-semiconductor combinations may result in an undercutting of the semiconductor so that some of the semiconductor underneath the outer perimeter, or edge, of the expanded oxide island 45 may be removed. In that event, care will need to be taken to provide a wide enough oxide sleeve 43 so that, when the etching step is completed and the semiconductor island has been formed underneath the expanded oxide island 45, the perimeter or edge of that remaining semiconductor island will be doped to a sufficient depth to meet the parameters just described.

From the foregoing it is apparent that a valuable process has been contributed by the present invention to the art of semiconductor fabrication. Its utility has been described with particular reference to a silicon-on-sapphire CMOS transistor pair comprising opposite conductivity type transistors. It is evident that the process could be employed to advantage with other types of semiconductors formed on different types of insulating substrates, and that single conductivity type transistors, particularly N-channel transistors, can be fabricated with greater freedom from radiation-induced edge conduction.

What is claimed is:

1. In a method for fabricating a field effect transistor in a semiconducting island carried by an insulating substrate, the technique of forming said island with its edges selectively doped, comprising the steps of:
    (a) forming a mask over a wafer comprising a layer of semiconducting material formed on an insulating substrate, said mask defining all but a narrow strip around the periphery of an island of semiconducting material which is to be formed;
    (b) implanting with a dopant the regions of said semiconducting material left exposed by said mask;
    (c) expanding said mask to cover said narrow peripheral strip of semiconducting material by,
        (i) forming an additional layer of masking material over said mask, said additional layer entirely covering said mask and extending onto the surface of said semiconducting material, and
        (ii) etching said additional layer until all of said layer except a ring thereof immediately surrounding said mask is removed;
    (d) removing those regions of said semiconducting material left exposed by said expanded mask; and
    (e) removing said expanded mask from said semiconducting material, thereby leaving on top of said substrate an island of edge doped semiconducting material.

2. The method of claim 1 characterized further in that said semiconducting material is silicon, said mask is silicon oxide, and said additional masking layer is also silicon oxide.

3. The method of claim 1 characterized further in that said additional masking layer is less resistant to said etching step than is said mask.

4. The method of claim 1 characterized further in that said etching step comprises reactive ion etching.

5. The method of claim 1 characterized further in that the thickness of said additional layer substantially equals the height of said mask.

6. In a method for fabricating a field effect transistor in a silicon island carried by an insulating substrate, the technique of forming said island with its edges selectively doped, comprising the steps of:
    (a) forming a silicon dioxide mask over a wafer comprising a silicon layer formed on an insulating substrate, said mask defining all but a narrow strip around the periphery of an island of silicon which is to be formed;
    (b) implanting with a dopant the regions of said silicon layer left exosed by said mask;
    (c) forming an additional layer of silicon dioxide over said mask, said additional layer entirely covering said mask and extending onto the surface of said silicon layer;
    (d) uniformly etching said additional silicon dioxide layer until all of said layer, except a ring thereof immediately surrounding said mask, is removed, said ring together with said mask forming an expanded silicon dioxide mask;
    (e) vertically etching those regions of said silicon layer left exposed by said expanded mask; and
    (f) removing said expanded mask from said silicon, thereby leaving on top of said substrate an island of edge doped silicon.

* * * * *